(12) United States Patent
Fukukawa et al.

(10) Patent No.: US 9,339,992 B2
(45) Date of Patent: May 17, 2016

(54) LOW-THERMAL-EXPANSION BLOCK POLYIMIDE, PRECURSOR THEREOF, AND USE THEREOF

(75) Inventors: Kenichi Fukukawa, Sodegaura (JP);
Tatsuhiro Urakami, Sodegaura (JP);
Yoshihiro Sakata, Sodegaura (JP);
Wataru Yamashita, Sodegaura (JP);
Masaki Okazaki, Sodegaura (JP)

(73) Assignee: MITSUI CHEMICALS, INC., Tokyo (JP)

( * ) Notice: Subject to any disclaimer, the term of this patent is extended or adjusted under 35 U.S.C. 154(b) by 1265 days.

(21) Appl. No.: 13/262,253

(22) PCT Filed: Mar. 18, 2010

(86) PCT No.: PCT/JP2010/001958
§ 371 (c)(1),
(2), (4) Date: Sep. 30, 2011

(87) PCT Pub. No.: WO2010/113412
PCT Pub. Date: Oct. 7, 2010

(65) Prior Publication Data
US 2012/0021234 A1   Jan. 26, 2012

(30) Foreign Application Priority Data

Mar. 31, 2009 (JP) .................................. 2009-087796
Jun. 29, 2009 (JP) .................................. 2009-153255

(51) Int. Cl.
| | |
|---|---|
| *B32B 15/08* | (2006.01) |
| *B32B 27/28* | (2006.01) |
| *C08G 73/10* | (2006.01) |
| *H05K 1/03* | (2006.01) |

(52) U.S. Cl.
CPC .............. *B32B 15/08* (2013.01); *B32B 27/281* (2013.01); *C08G 73/10* (2013.01); *H05K 1/0346* (2013.01); *Y10T 428/31681* (2015.04)

(58) Field of Classification Search
CPC ...... B32B 15/08; B32B 27/281; C08G 73/10; H05K 1/0346; Y10T 428/31681
See application file for complete search history.

(56) References Cited

U.S. PATENT DOCUMENTS

| | | | |
|---|---|---|---|
| 5,773,559 A | 6/1998 | Miyamoto et al. | |
| 6,710,160 B2 | 3/2004 | Yamashita et al. | |
| 2002/0188090 A1 | 12/2002 | Yamashita et al. | |
| 2007/0066737 A1 | 3/2007 | Gallucci et al. | |
| 2009/0263640 A1 | 10/2009 | Ding et al. | |
| 2010/0069520 A1 | 3/2010 | Kim et al. | |

FOREIGN PATENT DOCUMENTS

| | | |
|---|---|---|
| CN | 1392885 A | 1/2003 |
| CN | 1713033 A | 12/2005 |
| JP | 8-208835 A | 8/1996 |
| JP | 9-176315 A | 7/1997 |
| JP | 2002-161136 A | 6/2002 |
| JP | 2002-167433 A | 6/2002 |
| JP | 2002-234961 A | 8/2002 |
| JP | 2006-70096 A | 3/2006 |
| JP | 2006-291003 A | 10/2006 |
| JP | 2007-84818 A | 4/2007 |
| JP | 2007-169304 A | 7/2007 |
| JP | 2007-231224 A | 9/2007 |
| JP | 2008-81718 A | 4/2008 |
| JP | 2008-107766 A | 5/2008 |
| JP | 2008-168439 A | 7/2008 |
| JP | 2008-169237 A | 7/2008 |
| JP | 2010-18802 A | 1/2010 |
| TW | 2006-15332 | 5/2005 |

OTHER PUBLICATIONS

Machine translation of JP 2002-167433 (2002).*
Machine translation of JP 2008-168439 (2008).*
International Search Report (PCT/ISA/210) issued on May 18, 2010, by Japanese Patent Office as the International Searching Authority for International Application No. PCT/JP2010/001958.
Takahiko Nakano et al., Preparation of novel sulfonated block copolyimides for proton conductivity membranes, Polymers for Advanced Technologies, 2005, 16, pp. 753-757.

* cited by examiner

*Primary Examiner* — Callie Shosho
*Assistant Examiner* — John Freeman
(74) *Attorney, Agent, or Firm* — Buchanan, Ingersoll & Rooney PC

(57) ABSTRACT

Provided is a low-cost polyimide, containing cyclohexane diamine as a diamine unit, that has a low thermal expansion coefficient. Said block polyimide contains blocks having the repeating structural unit shown in formula (1A) and blocks having the repeating structural unit shown in formula (1B). This block polyimide is preferably obtained by imidizing a block polyamide acid imide that contains blocks having the repeating structural unit shown in formula (2A) and blocks having the repeating structural unit shown in formula (2B).

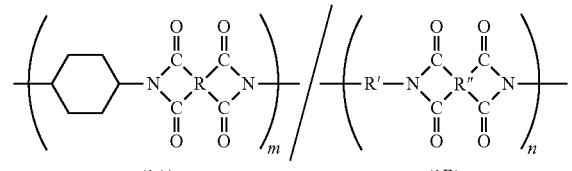

(1A)        (1B)

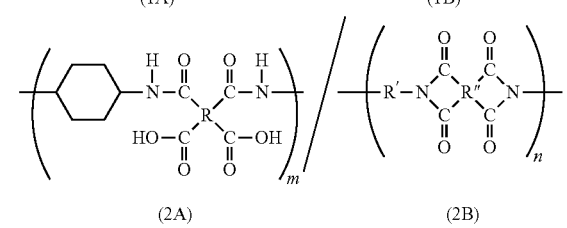

(2A)        (2B)

34 Claims, No Drawings

LOW-THERMAL-EXPANSION BLOCK POLYIMIDE, PRECURSOR THEREOF, AND USE THEREOF

TECHNICAL FIELD

The present invention relates to block polyimide material. More specifically, the present invention relates to a block polyimide containing a polyimide block having a cyclohexane diamine unit and other polyimide block, and to a block polyamic acid/imide as a precursor thereof.

BACKGROUND ART

Polyimides generally have superior heat resistance, mechanical properties and electrical characteristics compared to other general-purpose resins and engineering plastics, finding wide applications as molding materials, composite materials, electrical and electronics materials, optical materials, etc. In particular, polyimide/metal laminates, which have a metal foil and a polyimide layer and used as flexible printed boards and the like, require low warpage. However, polyimides generally have a higher coefficient of thermal expansion (CTE) than metals, which may contribute to the occurrence of warpage in polyimide/metal laminates.

Inorganic glass, a transparent material, is widely used as a panel substrate or other parts in display industries, including liquid crystal display and organic EL display. However, inorganic glass is increasingly suffering from the limitations of high specific gravity (weight), fragility, low flexibility, and so forth. Under this circumstance, research is being made on transparent materials that can replace glass. Plastic films made of transparent, heat-resistant resin have the advantages of reducing weight, imparting impact resistance, and good moldability. Moreover, there is an increasing expectation that the use of such plastic films makes it possible the development of flexible displays, which is very difficult with inorganic glass.

Polyimides have been reported that have cyclohexanediamine (CHDA) as a diamine unit (see Patent Literatures 1 to 4). Polyimides with a cyclohexanediamine unit may have the feature of low coefficient of thermal expansion (CTE) (see, e.g., Example 3 in Patent Literature 1). In addition, since the diamine unit has alicyclic structure, these polyimides have much higher transparency than those in which all diamine units have aromatic structure. However, since cyclohexanediamine is generally expensive, the compound is desired to be used in combination with other diamine such as norbornene diamine (NBDA) (see, e.g., claim 6 in Patent Literature 2) for cost reduction.

A technique for preparing a block polyimide by chemical imidization is known (see, e.g., Non-Patent Literature 1). Chemical imidization is a process whereby imidization is effected using such an imidization agent as acetic anhydride or pyridine. Generally, chemical imidization is a complex process that requires purification. In the case of thermal imidization, on the other hand, imidization can proceed by adding an azeotropic solvent such as xylene to a polyamic acid varnish (polymer solution of polyimide precursor) and heating the solution. However, thermal imidization is not a common method for preparing block polyimides.

CITATION LIST

Patent Literature

[PTL 1] Japanese Patent Application Laid-Open No. 2007-169304

[PTL 2] Japanese Patent Application Laid-Open No. 2008-81718

[PTL 3] Japanese Patent Application Laid-Open No. 2007-231224

[PTL 4] Japanese Patent Application Laid-Open No. 09-176315

[NPL 1] Polym. Adv. Technol., 2005, 16, 753-757, Preparation of novel sulfonated block copolyimides for proton conductivity membranes, T. Nakano, S. Nagaoka, H. Kawakami

SUMMARY OF INVENTION

Technical Problem

As described above, polyimides in which a combination of cyclohexanediamine and other diamine (e.g., norbornene diamine) is employed as a diamine unit are expected as a means of achieving low coefficient of thermal expansion and cost reduction at the same time. However, it has been found that the coefficient of thermal expansion of polyimides in which cyclohexanediamine and other diamine are randomly copolymerized shows a relatively sharp increase as the ratio of cyclohexanediamine decreases. It is therefore an object of the present invention to provide a polyimide with improved film properties (particularly coefficient of thermal expansion (CTE) and tensile modulus of elasticity) while aiming to achieve cost reduction by means of combination of cyclohexanediamine and other diamine, and ensuring excellent film transparency using the same proportion of cyclohexanediamine as that for random copolymerization.

Solution to Problem

The inventors have found that, by block copolymerization of cyclohexanediamine and other diamine, it is possible to ensure lower coefficient of thermal expansion even when the proportion of cyclohexanediamine is reduced to a certain level (or the proportion of other diamine is increased).

That is, a first aspect of the present invention relates to a block polyimide given below.

[1] A block polyimide including:
blocks of repeating units represented by formula (1A); and
blocks of repeating units represented by formula (1B),

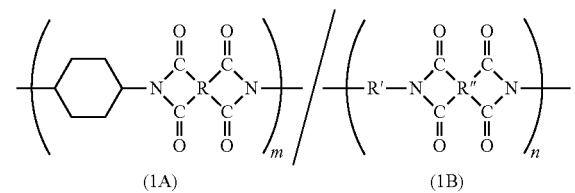

In the formula (1A) or (1B), m is the number of the repeating units represented by formula (1A), n is the number of the repeating units represented by formula (1B), a ratio of an average value of m to an average value of n ranges from 1:9 to 9:1, R and R' are independently an tetravalent group having 4 to 27 carbon atoms, and independently represent an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, and R' is a divalent group having 4 to 51 carbon atoms, and represents an aliphatic group, a monocyclic aliphatic group (except for 1,4-cyclohexylene), a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

As used herein, "block polyimide" means a structure having in a molecule thereof at least one structure composed of at least 4 repeating units represented by formula (1A), and at least one structure composed of at least 4 repeating units represented by formula (1B).

[2] The block polyimide according to [1], wherein the ratio of the average value of m to the average value of n ranges from 2:8 to 8:2.

[3] The block polyimide according to [1] or [2], wherein the average value of m and the average value of n are independently 2 to 1,000.

[4] The block polyimide according to any one of [1] to [3], wherein a cyclohexane skeleton in the repeating unit represented by formula (1A) has trans and cis isomers represented by formulas (1A-1) and (1A-2), respectively, and has a trans/cis ratio of 10:0 to 5:5.

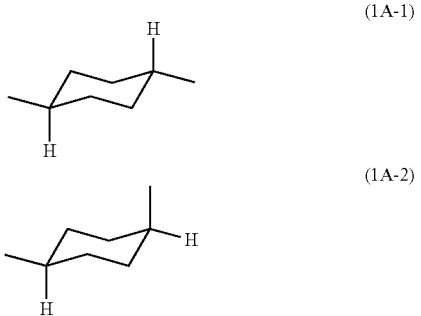

(1A-1)

(1A-2)

[5] The block polyimide according to any one of [1] to [4], wherein a logarithmic viscosity of the block polyimide in a 9:1 (weight ratio) mixture solvent of p-chlorophenol and phenol is 0.1 to 3.0 dl/g, as measured at 35° C. and at a block polyimide concentration of 0.5 g/dl.

A second aspect of the present invention relates to a block polyamic acid/imide given below.

[6] A block polyamic acid/imide including:
blocks of repeating units represented by formula (2A); and
blocks of repeating units represented by formula (2B),

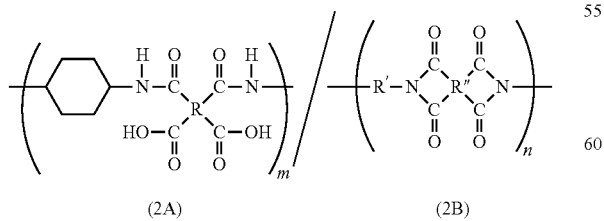

(2A)  (2B)

In formula (2A) or (2B), m is the number of the repeating units represented by formula (2A), n is the number of the repeating units represented by formula (2B), a ratio of an average value of m to an average value of n ranges from 1:9 to 9:1, R and R' are independently an tetravalent group having 4 to 27 carbon atoms, and independently represent an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, and R' is a divalent group having 4 to 51 carbon atoms, and represents an aliphatic group, a monocyclic aliphatic group (except for 1,4-cyclohexylene), a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

[7] The block polyamic acid/imide according to [6], wherein the ratio of the average value of m to the average value of n ranges from 2:8 to 8:2.

[8] The block polyamic acid/imide according to [6] or [7], wherein the average value of m and the average value of n are independently 2 to 1,000.

[9] The block polyamic acid/imide according to any one of [6] to [8], wherein a polyimide composed of the repeating units represented by formula (2B) is dissolvable in aprotic polar solvents.

[10] The block polyamic acid/imide according to any one of [6] to [9], wherein a logarithmic viscosity of the block polyamic acid/imide in N-methyl-2-pyrrolidone is 0.1 to 3.0 g/dl, as measured at 35° C. and at a block polyamic acid/imide concentration of 0.5 g/dl.

A third aspect of the present invention relates to a process of producing a block polyamic acid/imide, and the like, given below.

[11] A process of producing the block polyamic acid/imide according to [6] or [7], including:
reacting a polyamic acid composed of repeating units represented by formula (2A) with a polyimide composed of repeating units represented by formula (2B) in an aprotic polar solvent, the polyimide being dissolvable in the aprotic polar solvents;
wherein a cyclohexane skeleton in the repeating unit represented by formula (2A) has trans and cis isomers represented by formulas (2A-1) and (2A-2), respectively, and has a trans/cis ratio of 10:0 to 5:5.

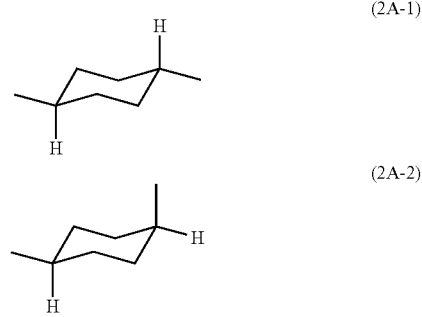

(2A-1)

(2A-2)

[12] A process of producing the block polyamic acid/imide according to [6] or [7], including:

reacting an amine-terminated polyamic acid represented by formula (2A') with an acid anhydride-terminated polyimide represented by formula (2B') in an aprotic polar solvent;

wherein the amine-terminated polyamic acid represented by formula (2A') is prepared from 1,4-cyclohexanediamine represented by formula (3) and from a tetracarboxylic dianhydride represented by formula (4), a ratio of 1,4-cyclohexanediamine represented by formula (3) to the tetracarboxylic dianhydride represented by formula (4) being in the range of greater than 1 to 2 or less, and the acid anhydride-terminated polyimide represented by formula (2B') is prepared from a diamine represented by formula (5) and from a tetracarboxylic dianhydride represented by formula (6), a ratio of the diamine represented by formula (5) to the tetracarboxylic dianhydride represented by formula (6) being in the range of 0.5 to less than 1,

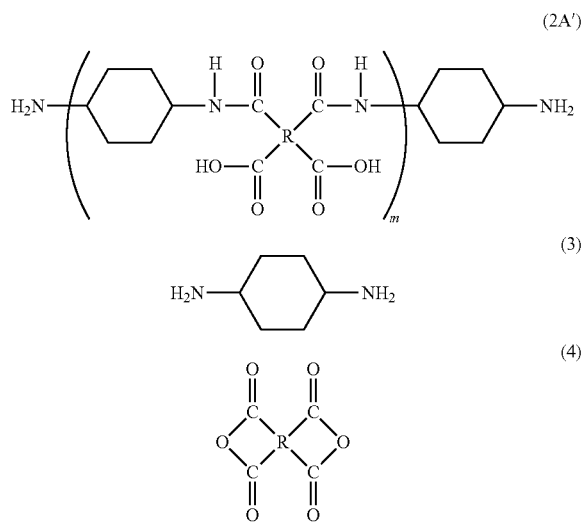

where R is an tetravalent group having 4 to 27 carbon atoms, and represents an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, 1,4-cyclohexanediamine has trans and cis isomers represented by formulas (3-1) and (3-2), respectively, and has a trans/cis ratio of 10:0 to 5:5,

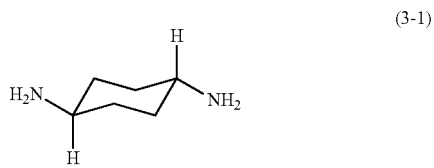

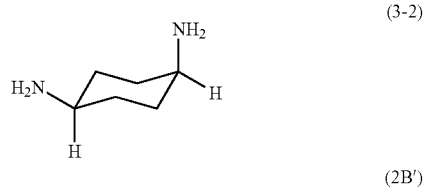

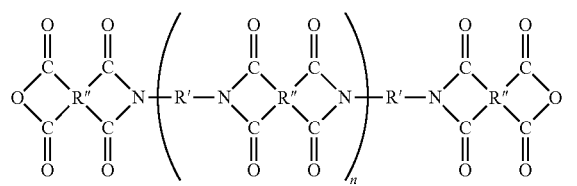

where R' is a divalent group having 4 to 51 carbon atoms, and represents an aliphatic group, a monocyclic aliphatic group (except for 1,4-cyclohexylene), a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, and R" is an tetravalent group having 4 to 27 carbon atoms, and represents an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

[13] A process of producing the block polyimide according to [1] or [2], including:
thermally or chemically imidizing a block polyamic acid/imide prepared by the process according to [11] or [12].

[14] A block polyamic acid/imide prepared by the process according to [11] or [12].

[15] A block polyimide prepared by the process according to [13].

A fourth aspect of the present invention relates to a block polyimide film and the like given below.

[16] A polyimide film including the block polyimide according to any one of [1] to [5].

[17] The polyimide film according to [16], wherein the number of double folds until failure in a folding endurance test is 10,000 or more and a coefficient of thermal expansion (CTE) is 10 to 30 ppm/K at 100° C. to 200° C.

[18] A metal-clad laminate prepared by laminating the polyimide film according to [16] or [17] to a metal foil.

[19] A polyamic acid/imide varnish including the block polyamic acid/imide according to [6] or [7].

[20] A metal-clad laminate prepared by applying the polyamic acid/imide varnish according to [19] over a metal foil.
[21] An optical film including the polyimide film according to [16] or [17].
[22] The optical film according to [21], wherein the optical film is used in display device applications.
[23] The optical film according to [21], wherein the optical film is a transparent substrate used as a panel for display devices.
[24] A display device including the optical film according to any one of [21] to [23].
[25] A polyimide resin composition including:
    the block polyimide according to any one of [1] to [5] and [15]; and
    a coloring agent.
[26] The polyimide resin composition according to [25], wherein the coloring agent is a whitening agent.
[27] The polyimide resin composition according to [26], wherein the whitening agent is titanium oxide.
[28] A block polyamic acid/imide composition including:
    the block polyamic acid/imide according to any one of [6] to and [14]; and
    a coloring agent.
[29] The block polyamic acid/imide composition according to [28], wherein the coloring agent is a whitening agent.
[30] The block polyamic acid/imide composition according to [29], wherein the whitening agent is titanium oxide.
[31] A display substrate material including the block polyimide according to any one of [1] to [5] and [15] or the polyimide resin composition according to any one of [25] to [27].
[32] A circuit board material including the block polyimide according to any one of [1] to [5] and [15] or the polyimide resin composition according to any one of [25] to [27].
[33] A coating material including the block polyimide according to any one of [1] to [5] and [15] or the polyimide resin composition according to any one of [25] to [27].
[34] A light reflector including the polyimide resin composition according to any one of [25] to [27] as a light reflecting material.

Advantageous Effects of Invention

A polyimide of the present invention contains cyclohexanediamine as a diamine unit, and achieves low coefficient of thermal expansion, high tensile modulus of elasticity, and cost reduction at the same time while ensuring high transparency. By employing the polyimide of the present invention, which has a low coefficient of thermal expansion, as a polyimide layer of a metal clad laminate, possible warpage of the metal clad laminate can be prevented. Moreover, the polyimide of the present invention, which has a low coefficient of thermal expansion (dimensional stability) as well as high transparency, is suitable in optical film applications and display device applications (e.g., panel substrate) and is thus of high practical value.

DESCRIPTION OF EMBODIMENTS

1. Block Polyimide

A block polyimide of the present invention has blocks of repeating units represented by formula (1A), and blocks of repeating units represented by formula (1B). A feature of the present invention is that the diamine unit in the repeating unit represented by formula (1A) is derived from cyclohexanediamine.

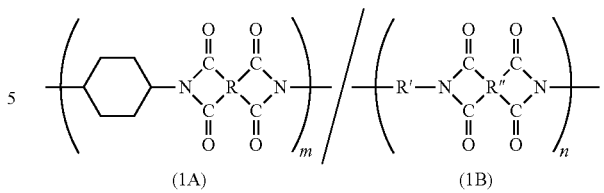

The subscripts m and n in formulas (1A) and (1B), respectively, denote the number of repeating units in the block. Preferably, an average value of m and an average value of n are independently 2 to 1,000, more preferably 5 to 500. As used herein, "average value of m" is a value obtained by dividing the total number of repeating units represented by formula (1A) by the total number of blocks of repeating units represented by formula (1A). As used herein, "average value of n" is a value obtained by dividing the total number of repeating units represented by formula (1B) by the total number of blocks of repeating units represented by formula (1B).

The number of repeating units for each type of block can be determined through, for example, the following procedure. First, oligomers represented by formula (2A') depicted later are reacted with a tagged terminal capping agent to produce first tagged oligomers. Similarly, oligomers represented by formula (2B') depicted later are reacted with a tagged terminal capping agent to produce second tagged oligomers. For each type of oligomer, the number of tagged terminal groups is quantified by $^1$H NMR spectroscopy or other method to determine the number of blocks, whereby the number of repeating units constituting one block can be found.

In the block polyimide of the present invention, in every block which is composed of repeating units represented by formula (1A), the number of repeating units is preferably 2 or more, more preferably 5 or more, further preferably 10 or more. Furthermore, the number of repeating units represented by formula (1A) in each block is preferably 50 or less in view of avoiding possible reduction in the compatibility between the oligomer represented by formula (2A') and the oligomer represented by formula (2B'), which are depicted later. Thus, since every block which is composed of repeating units represented by formula (1A) has at least a given number of repeating units, properties derived from the block is more likely to be exerted.

As to the ratio between m and n, the ratio of an average value of m to an average value of n preferably ranges from 9:1 to 1:9, more preferably 8:2 to 2:8. When m, the number of repeating units represented by formula (1A), is at a certain level or higher, the resultant block polyimide exhibits a low coefficient of thermal expansion. Moreover, when m is at a certain level or higher, the resultant block polyimide exhibits enhanced visible light transmissivity. On the other hand, since cyclohexanediamine is generally expensive as noted above, cost reduction is made possible by reducing the number of repeating units represented by formula (1A).

The ratio of the total number of repeating units represented by formula (1A) to the total number of repeating units represented by formula (1B) in the block polyimide also preferably ranges from 9:1 to 1:9, more preferably 8:2 to 2:8.

The block polyimide of the present invention, which has blocks of repeating units represented by formula (1A), exhibits properties derived from cyclohexanedimine, particularly low coefficient of thermal expansion, more likely than random polyimides having repeating units represented by formula (1A).

The cyclohexane skeleton in formula (1A) has trans and cis isomers represented by formulas (1A-1) and (1A-2), respectively.

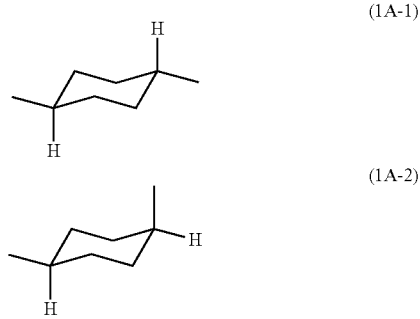

The cyclohexane skeleton in formula (1A) preferably has a trans:cis ratio of 10:0 to 5:5, more preferably 10:0 to 7:3. A high trans isomer content generally results in increased molecular weight; therefore, formation of a self-supporting film becomes easy. Thus, film formation becomes easy.

R in formula (1A) represents a tetravalent group. R preferably has 4 to 27 carbon atoms. Furthermore, R preferably represents an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

R in formula (1A) is a group derived from a tetracarboxylic dianhydride. The tetracarboxylic dianhydride may be, for example, aromatic tetracarboxylic dianhydride or alicyclic tetracarboxylic dianhydride.

Examples of aromatic tetracarboxylic dianhydrides include pyromellitic dianhydride, 3,3',4,4'-biphenyltetracarboxylic dianhydride, 3,3',4,4'-benzophenonetetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 4,4'-bis(3,4-dicarboxyphenoxy)biphenyl dianhydride, 2,2-bis[(3,4-dicarboxyphenoxy)phenyl]propane dianhydride, 2,3,6,7-naphthalenetetracarboxylic dianhydride, 1,4,5,8-naphthalenetetracarboxylic dianhydride 2,2',3,3'-benzophenonetetracarboxylic dianhydride, 2,2',3,3'-biphenyltetracarboxylic dianhydride, 2,2-bis(2,3-dicarboxyphenyl)propane dianhydride, 2,2-bis(2,3-dicarboxyphenyl)-1,1,1,3,3,3-hexafluoropropane dianhydride, bis(2,3-dicarboxyphenyl)ether dianhydride, bis(2,3-dicarboxyphenyl)sulfide dianhydride, bis(2,3-dicarboxyphenyl)sulfone dianhydride, 1,3-bis(2,3-dicarboxyphenoxy)benzene dianhydride, 1,4-bis(2,3-dicarboxyphenoxy)benzene dianhydride, 1,2,5,6-naphthalenetetracarboxylic dianhydride, 1,3-bis(3,4-dicarboxybenzoyl)benzene dianhydride, 1,4-bis(3,4-dicarboxybenzoyl)benzene dianhydride, 1,3-bis(2,3-dicarboxybenzoyl)benzene dianhydride, 1,4-bis(2,3-dicarboxybenzoyl)benzene dianhydride, 4,4'-isophthaloyldiphthalic anhydride, diazodiphenylmethane-3,3',4,4'-tetracarboxylic dianhydride, diazodiphenylmethane-2,2',3,3'-tetracarboxylic dianhydride, 2,3,6,7-thioxanthonetetracarboxylic dianhydride, 2,3,6,7-anthraquinonetetracarboxylic dianhydride, 2,3,6,7-xanthonetetracarboxylic dianhydride, and ethylenetetracarboxylic dianhydride.

Examples of alicyclic tetracarboxylic dianhydrides include cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]octo-7-ene-2,3,5,6-tetracarboxylic dianhydride, bicyclo[2.2.2]octane-2,3,5,6-tetracarboxylic dianhydride, 2,3,5-tricarboxycyclopentylacetic dianhydride, bicyclo[2.2.1]heptane-2,3,5-tricarboxylic-6-acetic dianhydride, 1-methyl-3-ethylcyclohexa-1-ene-3-(1,2),5,6-tetracarboxylic dianhydride, decahydro-1,4,5,8-dimethanonapthalene-2,3,6,7-tetracarboxylic dianhydride, 4-(2,5-dioxotetrahydrofuran-3-yl)-tetralin-1,2-dicarboxylic dianhydride, and 3,3',4,4'-dicyclohexyltetracarboxylic dianhydride.

When the tetracarboxylic dianhydride has an aromatic ring such as benzene ring, some or all of the hydrogen atoms on the aromatic ring may be substituted with a substituent selected from fluoro group, methyl group, methoxy group, trifluoromethyl group, and trifluoromethoxy group. Furthermore, when the tetracarboxylic dianhydride has an aromatic ring such as a benzene ring, depending on the purpose, some or all of the hydrogen atoms on the aromatic ring may be substituted with a substituent serving as a crosslinking site, selected from ethynyl group, benzocyclobutene-4'-yl group, vinyl group, allyl group, cyano group, isocyanate group, nitrile group, and isopropenyl group. In addition, a group serving as a crosslinking site, such as vinylene group, vinylidene group and/or ethynylidene group, may be incorporated into the main chain skeleton of the tetracarboxylic dianhydride, preferably in an amount that does not impair moldability.

Some of the tetracarboxylic dianhydride units may be derived from hexacarboxylic trianhydrides and/or octacarboxylic tetraanhydrides in order to introduce branches to the polyamid or polyimide.

The above tetracarboxylic dianhydrides may be used alone or in combination.

R' in formula (1B) represents a divalent group other than 1,4-cyclohexylene. R' preferably has 4 to 51 carbon atoms. Furthermore, R' preferably represents an aliphatic group, a monocyclic aliphatic group (except for 1,4-cyclohexylene), a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

R' in formula (1B) is a group derived from a diamine. There are no particular limitations on the diamine as long as a polyamic acid or polyimide can be produced.

The first examples of diamines are those having benzene ring(s). Examples of diamines having benzene ring(s) include:
  <1> diamines having one benzene ring, such as p-phenylenediamine, m-phenylenediamine, p-xylylenediamine, and m-xylylenediamine;
  <2> diamines having two benzene rings, such as 3,3'-diaminodiphenylether, 3,4'-diaminodiphenylether, 4,4'-diaminodiphenylether, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, and 1-(3-aminophenyl)-1-(4-aminophenyl)-1-phenylethane;

<3> diamines having three benzene rings, such as 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, and 2,6-bis(3-aminophenoxy)pyridine;

<4> diamines having four benzene rings, such as 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane;

<5> diamines having five benzene rings, such as 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, and 1,4-bis[4-(4-aminophenoxy)-α,α-dimethylbenzyl]benzene; and <6> diamines having six benzene rings, such as 4,4'-bis[4-(4-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, and 4,4'-bis[4-(4-aminophenoxy)phenoxy]diphenylsulfone.

The second examples of diamines include diamines having aromatic substituent(s), such as 3,3'-diamino-4,4'-diphenoxybenzophenone, 3,3'-diamino-4,4'-dibiphenoxybenzophenone, 3,3'-diamino-4-phenoxybenzophenone, and 3,3'-diamino-4-biphenoxybenzophenone.

The third examples of diamines include diamines having a spirobiindan ring, such as 6,6'-bis(3-aminophenoxy)-3,3,3',3'-tetramethyl-1,1'-spirobiindan, and 6,6'-bis(4-aminophenoxy)-3,3,3',3'-tetramethyl-1,1'-spirobiindan.

The fourth examples of diamines include siloxane diamines, such as 1,3-bis(3-aminopropyl)tetramethyldisiloxane, 1,3-bis(4-aminobutyl)tetramethyldisiloxane, α,ω-bis(3-aminopropyl)polydimethylsiloxane, and α,ω-bis(3-aminobutyl)polydimethylsiloxane.

The fifth examples of diamines include ethylene glycol diamines, such as bis(aminomethyl)ether, bis(2-aminoethyl)ether, bis(3-aminopropyl)ether, bis[2-(2-aminomethoxy)ethyl]ether, bis[2-(2-aminoethoxy)ethyl]ether, bis[2-(3-aminoprotoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether.

The sixth examples of diamines include alkylenediamines, such as ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

The seventh examples of diamines include alicyclic diamines, such as cyclobutanediamine, di(aminomethyl)cyclohexane[bis(aminomethyl)cyclohexanes, including trans-1,4-bis(aminomethyl)cyclohexane and 1,3-bis(aminomethyl)cyclohexane], diaminobicycloheptane, diaminomethylbicycloheptane (including norbornanediamines, such as norbornanediamine), diaminooxybicycloheptane, diaminomethyloxybicycloheptane (including oxanorbornanediamine), isophoronediamine, diaminotricyclodecane, diaminomethyltricyclodecane, bis(aminocyclohexyl)methane [or methylenebis(cyclohexylamine)], and bis(aminocyclohexyl)isopropylidene.

R'' in formula (1B) is a tetravalent group, which is derived from a tetracarboxylic dianhydride. Examples of R'' include the same groups as those for R in formula (1A).

The polyimide or polyimide oligomer composed of repeating units represented by formula (1B) is preferably dissolvable in aprotic polar solvents. As the aprotic polar solvents, aprotic amide solvents are effective; examples thereof include N,N-dimethylformamide, N,N-dimethylacetamide, N,N-diethylacetamide, N-methyl-2-pyrrolidone, 1,3-dimethyl-2-imidazolidinone, N-methylcaprolactam and hexamethylphosphorotriamide, with N,N-dimethylformamide, N,N-dimethylacetamide, N,N-diethylacetamide, N-methyl-2-pyrrolidone and 1,3-dimethyl-2-imidazolidinone being preferable. As used herein "dissolve" means that dissolution amount is 10 g/l or more, more preferable 100 g/l or more.

As will be described later, the block polyimide of the present invention can be prepared by reacting a polyimide oligomer composed of repeating units represented by formula (2B) with a polyamic acid oligomer composed of repeating units represented by formula (2A) in an protic polar solvent to produce a block polyamic acid/imde, and imidizing the block polyamic acid/imide. Here, when the polyimide composed of repeating units represented by formula (2B) can be dissolved in the aprotic polar solvent, the polyimide oligomer composed of repeating units represented by formula (2B) and the polyamic acid oligomer composed of repeating units represented by formula (2A) can be homogeneously mixed together, so that the block polyamic acid/imide can be easily prepared.

The logarithmic viscosity of a solution of the block polyimide of the present invention in a 9:1 (weight ratio) mixture solvent of p-chlorophenol and phenol (concentration: 0.5 g/dl) is preferably 0.1 to 3.0 dl/g at 35° C. Within this range the block polyimide has a practical molecular weight, and the solution can be readily applied at a desired solid content. When the logarithmic viscosity is too high, polymerization generally becomes difficult, and moreover, solubility may decrease.

2. Block Polyamic Acid/Imide

A block polyamic acid/imide of the present invention has blocks of repeating units represented by the following formula (2A), and blocks of repeating units represented by the following formula (2B).

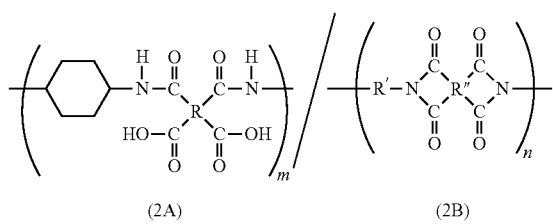

(2A)  (2B)

The block polyamic acid/imide of the present invention may serve as a precursor of the polyaimide described above. Thus, R and m in formula (2A) are defined the same as those for formula (1A). R, R' and n in formula (2B) are also defined the same as those for formula (1B).

The logarithmic viscosity of a solution of the block polyamic acid/imide of the present invention in N-methyl-2-pyrrolidone (concentration: 0.5 g/dl) is preferably 0.1 to 3.0 dl/g at 35° C. This is because application of the polyamic acid solution becomes easy.

The polyamic acid/imide of the present invention can be used in a variety of applications; it can be used as a varnish component. The varnish contains the polyamic acid/imide of the present invention and a solvent. There are no particular limitations on the concentration of the polyamic acid/imide. Solvent removal by means of drying becomes easy at higher concentrations, and therefore, the polyamic acid/imide concentration may be, for example, 15 wt % or higher. Application of the varnish becomes difficult at extreme concentrations, and therefore, the polyamic acid/imide concentration may be, for example, 50 wt % or less. The solvent used for the varnish is preferably an aprotic polar solvent.

3. Process of Producing Block Polyamic Acid/Imide and Polyimide

The block polyamic acid/imide of the present invention can be prepared by reacting a polyamic acid (polyamic acid oligomer) composed of repeating units represented by formula (2A) with a polyimide (polyimide oligomer) composed of repeating units represented by formula (2B). This reaction is preferably conducted in a solvent, more preferably in an aprotic polar solvent.

The block polyamic acid/imide of the present invention is prepared using a polyamic acid oligomer composed of repeating units represented by formula (2A), which is preferably an amine-terminated polyamic acid oligomer as represented by the following formula (2A'). R and m in formula (2A') are defined the same as those for formula (2A). The logarithmic viscosity of a solution of the polyamic acid oligomer in N-methyl-2-pyrrolidone (concentration: 0.5 g/dl) is preferably 0.1 to 3.0 dl/g, more preferably 0.3 to 3.0 dl/g at 35° C.

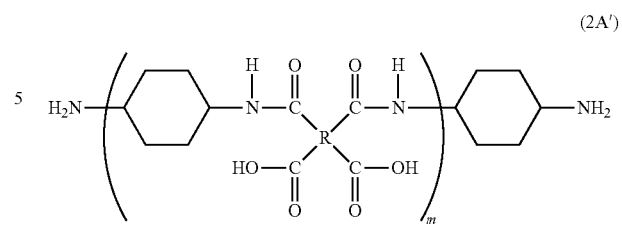

The block polyamic acid/imide of the present invention is also prepared using a polyimide oligomer composed of repeating units represented by formula (2B), which is preferably an acid anhydride-terminated polyimide oligomer as represented by the following formula (2B'). R', R" and n in formula (2B') are defined the same as those for formula (2B). The logarithmic viscosity of a solution of the polyimide oligomer in N-methyl-2-pyrrolidone (concentration: 0.5 g/dl) is preferably 0.01 to 3.0 dl/g, more preferably 0.05 to 2.0 dl/g at 35° C.

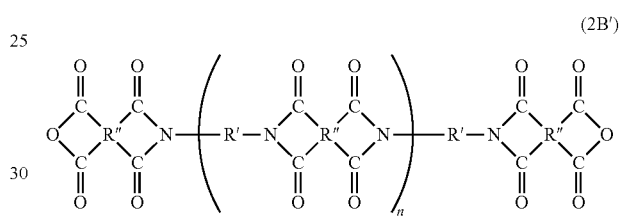

By terminating the polyamic acid oligomer represented by formula (2A) with an acid anhydride and by terminating the polyimide oligomer represented by formula (2B) with an amine, gelation is more likely to occur during thermal imidization. The exact cause of gelation still remains elusive; however, it may be due to the presence of excess amine moieties and acid anhydride moieties, which form surplus bonds other than imide bond which form a crosslinked network.

The polyamic acid oligomer represented by formula (2A') can be prepared by condensation of 1,4-cyclohexanediamine represented by formula (3) with a tetracarboxylic dianhydride represented by formula (4). The mole ratio of the tetracarboxylic dianhydride represented by formula (4) to the diamine represented by formula (3) in the dehydration condensation reaction is preferably 0.5 to less than 1.0, more preferably 0.7 to less than 1, for the purpose of preparing an amine-terminated polyamic acid oligomer with a properly controlled molecular weight.

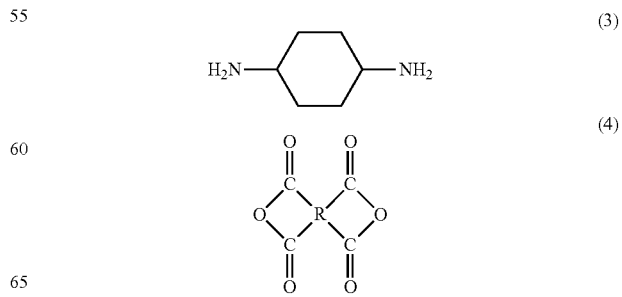

1,4-cyclohexanediamine represented by formula (3) has trans and cis isomers represented by formulas (3-1) and (3-2), respectively. The trans:cis ratio of 1,4-cyclohexanediamine in the reaction is preferably 10:0 to 5:5. A high trans isomer content results in increased molecular weight; therefore, formation of a self-supporting film becomes easy. Thus, film formation becomes easy.

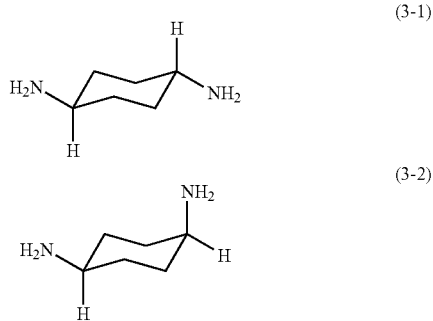

R in formula (4) represents a tetravalent group which is defined the same as that in formula (1A).

The polyimide oligomer represented by formula (2B') can be prepared by dehydration condensation of a dimaine represented by formula (5) with a tetracarboxylic dianhydride represented by formula (6), followed by imidization. The mole ratio of the diamine represented by formula (5) to the tracarboxylic dianhydride represented by formula (6) in the dehydration condensation reaction is preferably 0.5 to less than 1.0, more preferably 0.7 to less than 1, for the purpose of preparing acid anhydride-terminated polyimide oligomer with a properly controlled molecular weight.

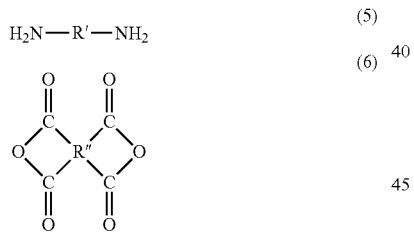

Dehydration condensation of the diamine with the tetracarboxylic anhydride is preferably conducted in a reaction solvent. The reaction solvent may be an aprotic polar solvent or a water-soluble alcohol solvent, but is preferably an aprotic polar solvent. Examples of aprotic polar solvents include N-methylpyrrolidone, N,N-dimethylformamide, N,N-dimethylacetamide, dimethylsulfoxide and hexamethylphosphoramide; and ether compounds such as 2-methoxyethanol, 2-ethoxyethanol, 2-(methoxymethoxy)ethoxyethanol, 2-isopropoxyethanol, 2-butoxyethanol, tetrahydrofurfurylalcohol, diethylene glycol, diethylene glycol monomethyl ether, diethylene glycol monoethyl ether, diethylene glycol monobutyl ether, triethylene glycol, triethylene glycol monoethyl ether, tetraethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polyethylene glycol, polypropylene glycol, tetrahydrofuran, dioxane, 1,2-dimethoxyethane, diethylene glycol dimethyl ether, and diethylene glycol diethyl ether. Examples of water-soluble alcohol solvents include methanol, ethanol, 1-propanol, 2-propanol, tert-butylalcohol, ethylene glycol, 1,2-propanediol, 1,3-propanediol, 1,3-butanediol, 1,4-butanediol, 2,3-butanediol, 1,5-pentanediol, 2-butene-1,4-diol, 2-methyl-2,4-pentanediol, 1,2,6-hexanetriol, and diacetonealcohol.

These solvents can be used alone or in combination for the dehydration condensation reaction. Preferred examples include N,N-dimethylacetamide, N-methylpyrrolidone, and a combination thereof.

A polyamic acid oligomer composed of repeating units represented by formula (2A), preferably by formula (2A'), and a polyimide oligomer composed of repeating units represented by formula (2B), preferably by formula (2B'), are mixed together in an aprotic polar solvent to produce a block polyamide/imide. There are no particular limitations on the aprotic polar solvent as long as the polyimide oligomer composed of repeating units represented by formula (2B) dissolvable therein; for example, N-methyl-2-pyrrolidone may be employed. Mixing may be effected using a three-one motor, homomixer, planetary mixer, homogenizer, or impeller-less mixing/defoaming mixer. Alternatively, mixing may be effected by kneading at 10° C. to 150° C.

The block polyamic acid/imide obtained may be converted into a block polyimide by imidization. There are no particular limitations on the imidization method; imidization may be effected either thermally or chemically. Examples of the imidization method include, but not limited to, the following methods (it is of course possible to imidize a coating of varnish as described above):

(1) Imidization by heating a block polyamic acid/imide in solvent to 100° C. to 400° C. (thermal imidization);
(2) Chemically imidizing a block polyamic acid/imide in solvent using such an imidization agent as acetic anhydride (chemical imidization); and
(3) Imidizing a block polyamic acid/imide in solvent under the presence of an azeotropic dehydration solvent, under the presence or absence of a catalyst (azeotropic dehydration condensation).

4. Polyimide Resin Composition

Where necessary, various additives may be added to the block polyimide of the present invention to produce a polyimide resin composition. Examples of additives include fillers, wear resistance improvers, flame retardancy improvers, tracking resistance improvers, thermal conductivity improvers, antifoaming agents, levelling agents, surface tension modifiers, and coloring agents. For its high transparency, the block polyimide of the present invention can be easily colored by a coloring agent. Moreover, for its high bend resistance, it is less likely to become brittle even when a coloring agent is added abundantly.

The coloring agent may be organic or inorganic, or may be a fluorescent pigment. There are no particular limitations on the color of the coloring agent; color can be appropriately determined depending on the intended use. For example, when the block polyimide of the present invention is used as a light reflecting material, light beam reflectivity can be enhanced by the addition of a whitening agent such as white inorganic filler or fluorescent brightener.

Examples of white inorganic fillers include metal oxides such as titanium oxide, zinc oxide, magnesium oxide, alumina, and silica; inorganic metal salts such as calcium carbonate, barium sulfate, calcium sulfate, magnesium sulfate, aluminum sulfate, magnesium chloride, and basic magnesium carbonate; metal hydroxides such as magnesium hydroxide, aluminum hydroxide, and calcium hydroxide; and clay-based minerals such as talc, mica, and caoline, with titanium oxide and zinc oxide being preferable.

There are no particular limitations on the particle shape of white inorganic fillers; it may be needle-like shape, plate-like shape, or spherical. The average particle diameter of the white inorganic filler is preferably 0.05 to 15 μm, more preferably 0.1 to 10 μm.

The white inorganic filler is preferably added in an amount of 100 to 500 parts by weight, more preferably 20 to 400 parts by weight, per 100 parts by weight of polyimide resin. Within these ranges, sufficient light beam reflectivity can be achieved for the resultant polyimide film, and film strength is less likely to drop.

Such a polyimide resin composition can be suitably prepared by mixing the polyamic acid/imide of the present invention with additives such as white inorganic fillers to produce a polyamic acid/imide composition, and imidizing the polyamic acid/imide composition.

5. Applications

As described above, the block polyimide of the present invention has a low coefficient of thermal expansion. Thus, the block polyimide may be suitably used for polyimide-metal laminates, such as circuit boards.

That is, a polyimide-metal laminate can be prepared by applying a varnish containing the polyamic acid/imide of the present invention on a metal foil, followed by drying and imidization. For example, by forming a coat of the polyamic acid/imide varnish of the present invention on a copper or copper alloy foil, a metal clad laminate for circuit boards is manufactured. On the other hand, by drying and imidizing the polyamic acid applied on a substrate and peeling off the resultant film, a polyimide film can be obtained. A metal-clad laminate can also be obtained by laminating the resultant polyimide film to a metal foil.

As described above, a feature of a polyimide prepared from the polyamic acid/imide of the present invention is its low coefficient of thermal expansion. Thus, the metal-clad laminate exhibits shape stability, such as reduced warpage.

Optionally, the polyimide-metal laminate further includes an insulating base film in addition to polyimide prepared from the polyamic acid/imide of the present invention. For example, a polyimide film to be laminated to a metal foil may be an insulating base film having a polyimide resin film of the present invention on its surface. The insulating base film is preferably flexible.

The material of the flexible insulating base film may be polyimide, polybenzimidazole, polybenzoxazole, polyamide (including aramide), polyetherimide, polyamideimide, polyester (including liquid crystal polyester), polysulfone, polyethersulfone, polyetherketone, or polyetheretherketone, with polyimide, polybenzimidazole, polyamide (aramide), polyetherimide, polyamideimide, and polyethersulfone being preferable, for example. There are no particular limitations on the thickness of the flexible insulating base film; however, it is preferably 3 to 150 μm.

The metal layer is not limited to a metal foil and may be a metal layer formed by sputtering, vapor deposition or other gas phase method or by electroplating such as electroless plating onto a polyimide film of the present invention or an insulating base film on which a polyimide resin layer is formed.

Vapor deposition methods include, in addition to general vapor deposition, CVD and ion-plating. When forming a metal layer by vapor deposition, the surface of a polyimide resin layer on which the metal layer is to be formed may be subjected to known pre-treatment such as plasma treatment or sand blast treatment.

A block polyimide film prepared by drying and subsequent imidization of a polyamic acid/imide varnish of the present invention applied on a substrate is a low-cost film as well as exhibits a low coefficient of thermal expansion (good dimensional stability) while having high transparency. Accordingly, as a transparent, heat-resistant plastic film, the block polyimide film can be suitably used in various applications, including optical films, films and substrates for display devices (display substrate materials), films for other applications, and (transparent) coating materials for coating well-designed molded articles. Moreover, the block polyimide film can be used as light reflecting material, light shielding material or the like colored by a coloring agent (e.g., inorganic pigment or organic dye).

Examples of optical films include polarizer protection films, phase difference films, antireflection films, electromagnetic wave shield films, and transparent conductive films. Examples of films and substrates for display devices include flexible display substrates, flat panel display substrates, inorganic/organic EL display substrates, touch panel substrates, and electronic paper substrates. Examples of films and substrates for other applications include solar battery substrates, flexible circuit board substrates, and optical disc protection films.

The heat-resistant plastic film or substrate may be a laminate of a plurality of films. The laminate may be prepared by bonding together a plurality of films, for example by the use of an adhesive or a good solvent. A smooth layer, a hardcoat layer, a gas barrier layer, a transparent conductive layer and the like may be formed on the heat-resistant plastic film or substrate as needed. Additional optical film(s) may be further laminated to the heat-resistant plastic film or substrate to form a laminate film. These laminates can be particularly used as panel substrates for display devices.

The light reflecting material is preferably used for liquid crystal displays and the like, preferably for LED backlight units.

Such a light reflecting material can be prepared from a polyimide resin composition containing a block polyimide of the present invention and a whitening agent such as a white inorganic filler, for example. On a surface of light reflecting material, which is not the light reflecting surface, may be provided with additional layer(s) to provide a light reflector. Specific examples, particle shape and formulation amount of the white inorganic filler are the same as described above.

The light reflecting material preferably has light reflectivity of 50% or more at 550 nm wavelength. Light reflectivity can be measured with Hitachi U-3010 spectrophotometer (Hitachi High-Technologies Corporation). Specifically, light reflectivity is measured over the range from 300 nm to 800 nm, and a value for light reflectivity measured at 550 nm is employed as a representative value.

The thickness of the light reflecting material is preferably 5 to 200 μm, more preferably 10 to 100 μm.

The light reflecting material is not limited to films; it can be used in various optical applications including pickup lenses, microlens arrays, light guides, optical fibers and optical waveguides.

EXAMPLES

Hereinafter, the present invention will be described in more detail with reference to Examples, which however shall not be construed as limiting the scope of the invention thereto.

1) Intrinsic Logarithmic Viscosity

Samples are dissolved in N-methyl-2-pyrrolidone (NMP) to a solid content of 0.5 dL/g, and measurements are made at 35° C. using a Ubbelohde viscometer.

2) Glass Transition Temperature (Tg) and Coefficient of Thermal Linear Expansion (CTE)

Measurements are made with TMA-50 manufactured by Shimadzu Co. in a nitrogen stream at a heating rate of 10° C./minute at a load of 14 g/mm² per unit sectional area. The coefficient of thermal linear expansion is measured at 100° C. to 200° C.

3) Tensile Test

Dumbbell-shaped test pieces punched out with a punching machine are prepared and measurements are made using a tensile tester (EZ-S, Shimadzu Corporation) under the following condition: gauge length=5 mm, tension rate=30 mm/min. In a stress-strain curve obtained by 10 measurements, the maximum stress point is defined as "tensile strength (unit: MPa)," an area under the curve from the origin to rupture is defined as "tensile modulus of elasticity (unit: GPa)," and the strain at that point is defined as "extension (%)."

4) Total Light Transmittance

Measurements are made with HZ-2 (a TM double beam system) manufactured by Suga Test Instruments Co., Ltd. at an opening size of Φ20 mm with a D65 light source. The film thickness of the test samples is set to 20 to 30 μm.

5) Evaluation of Folding Endurance

Tester: MIT folding endurance tester
Tension: 1.0 kg
Folding angle: 135° (on each side)
Folding rate: 175 double folds per minute
Curvature radius: 0.38 mm
Clamp gap: 0.3 mm
Sampling direction: Machine direction (MD)
Test piece dimension: approx. 120 mm length×15 mm width
Number of Tests: n=5

The test results are ranked in terms of the number of double folds until failure as follows: A (>100,000 double folds), B (10,000 to 100,000 (not inclusive) double folds), C (1,000 to 10,000 (not inclusive) double folds), and D (<1,000 double folds). The results are listed in Tables 5 and 6.

The following depicts diamines and tetracarboxylic dianhydrides from which block polyimides or block polyamic/imdes are synthesized.

Compound 1: 1,4-cyclohexanediamine (tCHDA) (trans isomer ratio: 99%).

Compound 1

Compound 2: norbornene diamine (NBDA)

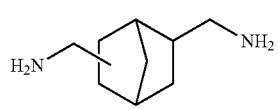

Compound 2

Compound 3: 3,3',4,4'-biphenyltetracarboxylic dianhydride (BPDA)

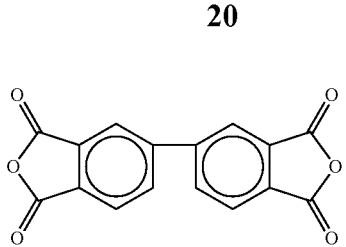

Compound 3

Compound 4: 3,3',4,4'-dicyclohexyltetracarboxylic dianhydride (BPDA-H)

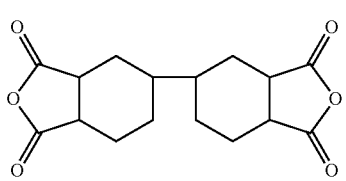

Compound 4

The solvent used for the synthesis is N-methylpyrrolidone (NMP).

Synthesis of Polyamic Acid or Oligomer Thereof

Synthesis Example 1-1

11.4 g (0.100 mol) of 1,4-diaminocyclohexane (CHDA) and as an organic solvent 109 g of N-methylpyrrolidone (NMP) are charged into a 300 mL five-neck separable flask fitted with a thermometer, a stirrer and a nitrogen inlet, and stirred. To the clear solution produced is added 25.0 g (0.0850 mol) of 3,3',4,4'-biphenyltetracarboxylic dianhydride (BPDA) in the form of powder, and the reaction vessel is placed in an 120° C. oil bath for 5 minutes. A short time after the addition of BPDA, salt is precipitated from the solution, resulting in increased viscosity in the form of heterogeneous mixture. After removing the oil bath, the solution is stirred for a further 18 hours at room temperature to produce a solution containing CHDA-derived amine-terminated polyamic acid oligomer (polyimide precursor polymer varnish).

The polyamic acid oligomer thus obtained is difficult to be further diluted by NMP; therefore, intrinsic logarithmic viscosity cannot be measured. The polyamic acid solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours. The resultant polyimide film is not self-supportive.

Synthesis Example 1-2

A solution containing CHDA-derived amine-terminated polyamic acid oligomer (polyimide precursor polymer varnish) is obtained in the same manner as in Synthesis Example 1-1 except that 16.0 g (0.140 mol) of CHDA, 168 g of NMP, and 37.1 g (0.126 mol) of BPDA are added.

The polyamic acid oligomer thus obtained is difficult to be further diluted by NMP; therefore, intrinsic logarithmic viscosity cannot be measured. The polyamic acid solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours. The resultant polyimide film is not self-supportive.

Synthesis Example 1-3

A solution containing CHDA-derived amine-terminated polyamic acid oligomer (polyimide precursor polymer varnish) is obtained in the same manner as in Synthesis Example 1-1 except that 14.8 g (0.130 mol) of CHDA, 181 g of NMP, and 36.3 g (0.124 mol) of BPDA are added.

The resultant polyamic acid oligomer has an intrinsic logarithmic viscosity of 0.74 dL/g (35° C., 0.5 g/dL). The polyamic acid solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours. The resultant polyimide film is not self-supportive.

Synthesis Example 1-4

A solution containing a polyamic acid (polyimide precursor polymer varnish) in which a diamine has been reacted with an equimolar amount of a tetracarboxylic dianhydride is obtained in the same manner as in Synthesis Example 1-1 except that 9.14 g (0.0800 mol) of CHDA, 185 g of NMP, and 23.5 g (0.0800 mol) of BPDA are added.

The resultant polyamic acid has an intrinsic logarithmic viscosity of 1.32 dL/g (35° C., 0.5 g/dL). The polyamic acid solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours. Finally, the coating of polyimide is stripped off the glass substrate to give a self-supportive polyimide film.

The resultant polyimide film has a coefficient of thermal expansion (CTE) of 9 ppm/K at 100° C. to 200° C., and a glass transition temperature (Tg) of 295° C. Test results are listed in Table 1 below.

TABLE 1

Synthesis of Polyamic Acid or Oligomer Thereof

| Synthesis Example | Intrinsic Viscosity [dL/g] | Diamine | Acid anhydride (Mole ratio with respect to diamine) |
|---|---|---|---|
| 1-1 | — | CHDA | BPDA (0.85) |
| 1-2 | — | CHDA | BPDA (0.90) |
| 1-3 | 0.74 | CHDA | BPDA (0.95) |
| 1-4 | 1.32 | CHDA | BPDA (1) |

Synthesis of Polyimide or Oligomer Thereof

Synthesis Example 2-1

11.6 g (0.0750 mol) of norbornene diamine (NBDA) and 95.6 g of N-methylpyrrolidone (NMP) are charged into a 300 mL five-neck separable flask equipped fitted with a thermometer, a stirrer and a nitrogen inlet, and stirred. To the clear solution produced is added 29.4 g (0.100 mol) of 3,3',4,4'-biphenyltetracarboxylic dianhydride (BPDA) in the form of powder, and the reaction vessel is placed in an 120° C. oil bath for 5 minutes. Salt is precipitated from the solution after the addition of BPDA, but is immediately re-dissolved in the solution to give a clear homogenous solution while involving viscosity increase.

The separable flask is fitted with a condensor and a Dean-Stark trap, and 80 g of xylene is added to the reaction solution. A dehydration thermal imidization reaction is effected at 180° C. for 4 hours under stirring. By distillation of xylene, a BPDA-derived acid anhydride-terminated polyimide oligomer solution (polyimide oligomer varnish) is produced.

The resultant polyimide oligomer has an intrinsic logarithmic viscosity of 0.08 dL/g (35° C., 0.5 g/dL). Since the polyimide oligomer solution is less viscous and is of relatively low molecular weight, a self-supportive polyimide film cannot be prepared from the polyimide oligomer solution.

Synthesis Example 2-2

A BPDA-derived acid anhydride-terminated polyimide oligomer solution (polyimide oligomer varnish) is obtained in the same manner as in Synthesis Example 2-1 except that 12.3 g (0.0800 mol) of NBDA, 125 g of NMP, 29.4 g (0.100 mol) of BPDA, and 80.0 g of xylene are added.

The resultant polyimide oligomer has an intrinsic logarithmic viscosity of 0.10 dL/g (35° C., 0.5 g/dL). Since the polyimide oligomer solution is less viscous and is of relatively low molecular weight, a self-supportive polyimide film cannot be prepared from the polyimide oligomer solution.

Synthesis Example 2-3

A BPDA-derived acid anhydride-terminated polyimide oligomer solution (polyimide varnish) is obtained in the same manner as in Synthesis Example 2-1 except that 13.9 g (0.0900 mol) of NBDA, 130 g of NMP, 29.4 g (0.100 mol) of BPDA, and 80.0 g of xylene are added.

The resultant polyimide oligomer has an intrinsic logarithmic viscosity of 0.10 dL/g (35° C., 0.5 g/dL). Since the polyimide oligomer solution is less viscous and is of relatively low molecular weight, a self-supportive polyimide film cannot be prepared from the polyimide oligomer solution.

Synthesis Example 2-4

A BPDA-derived acid anhydride-terminated polyimide oligomer solution (polyimide varnish) is obtained in the same manner as in Synthesis Example 2-1 except that 14.7 g (0.0950 mol) of NBDA, 132 g of NMP, 29.4 g (0.100 mol) of BPDA, and 85.0 g of xylene are added.

The resultant polyimide oligomer has an intrinsic logarithmic viscosity of 0.15 dL/g (35° C., 0.5 g/dL). Since the polyimide oligomer solution is less viscous and is of relatively low molecular weight, a self-supportive polyimide film cannot be prepared from the polyimide oligomer solution.

Synthesis Example 2-5

A solution containing polyamic acid in which a diamine has been reacted with an equimolar amount of a tetracarboxylic dianhydride (polyimide precursor polymer), i.e., polyimide precursor polymer varnish, is obtained in the same manner as in Synthesis Example 2-1 except that 15.4 g (0.100 mol) of NBDA, 135 g of NMP, and 29.4 g (0.100 mol) of BPDA are added.

The resultant polyimide precursor polymer varnish has an intrinsic logarithmic viscosity of 0.44 dL/g (35° C., 0.5 g/dL). The polyimide precursor polymer solution is spread over a glass substrate using a doctor blade. The glass substrate is placed in an oven. In a nitrogen gas stream, the glass substrate is heated from 50° C. to 250° C. over 2 hours, and heated at 250° C. for a further 2 hours. Finally, the coating of polyimide is stripped off the glass substrate to give a self-supportive polyimide film.

80.0 g of xylene is added to the polyimide precursor polymer varnish, and a dehydration thermal imidization reaction is effected at 180° C. for 4 hours under stirring. By distillation of xylene, a polyimide solution (polyimide varnish) is obtained from the polyamic acid. The resultant polyimide has an intrinsic logarithmic viscosity of 0.16 dL/g (35° C., 0.5 g/dL).

TABLE 2

Synthesis of Polyimide, Polyimide Precursor Polymer, or oligomer thereof

| Synthesis Example | Intrinsic Viscosity [dL/g] | Diamine (Mole ratio with respect to acid anhydride) | Acid anhydride |
|---|---|---|---|
| 2-1 | 0.08 | NBDA (0.75) | BPDA |
| 2-2 | 0.10 | NBDA (0.80) | BPDA |
| 2-3 | 0.10 | NBDA (0.90) | BPDA |
| 2-4 | 0.15 | NBDA (0.95) | BPDA |
| 2-5 | 0.44 (precursor) 0.16 (imide) | NBDA (1) | BPDA |

Synthesis Example 3-1

A BPDA-derived acid anhydride-terminated polyimide oligomer solution (polyimide oligomer varnish) is obtained in the same manner as in Synthesis Example 2-1 except that 13.9 g (0.0900 mol) of NBDA, 134 g of NMP, 30.6 g (0.100 mol) of 3,3',4,4'-dicyclohexyltetracarboxylic dianhydride (BPDA-H), and 85.0 g of xylene are added.

The resultant polyimide oligomer solution has an intrinsic logarithmic viscosity of 0.12 dL/g (35° C., 0.5 g/dL). Since the polyimide oligomer solution is less viscous and is of relatively low molecular weight, a self-supportive polyimide film cannot be prepared from the polyimide oligomer solution.

Synthesis Example 3-2

A solution containing polyamic acid in which a diamine has been reacted with an equimolar amount of a tetracarboxylic dianhydride (polyimide precursor polymer), i.e., polyimide precursor polymer varnish, is obtained in the same manner as in Synthesis Example 2-1 except that 1.85 g (0.0120 mol) of NBDA, 16.6 g of NMP, and 3.68 g (0.0120 mol) of 3,3',4,4'-dicyclohexyltetracarboxylic dianhydride (BPDA-H) are added.

The resultant polyimide precursor polymer varnish has an intrinsic logarithmic viscosity of 0.52 dL/g (35° C., 0.5 g/dL). The polyimide precursor polymer solution is spread over a glass substrate using a doctor blade. The glass substrate is then placed in an oven. In a nitrogen gas stream, the glass substrate is heated from 50° C. to 250° C. over 2 hours, and heated at 250° C. for a further 2 hours. Finally, the coating of polyimide is stripped off the glass substrate to give a self-supportive polyimide film.

TABLE 3

Synthesis of Polyimide Oligomer or Polyimide Precursor Polymer

| Synthesis Example | Intrinsic Viscosity [dL/g] | Diamine (Mole ratio with respect to acid anhydride) | Acid anhydride |
|---|---|---|---|
| 3-1 | 0.12 | NBDA (0.90) | BPDA-H |
| 3-2 | 0.52 | NBDA (1) | BPDA-H |

Synthesis of Random Polyimide Precursor Polymer

Synthesis Example 4-1

4.57 g (0.0400 mol) of 1,4-diaminocyclohexane (CHDA), 6.17 g (0.0400 mol) of norbornene diamine (NBDA) and 137 g of N-methylpyrrolidone (NMP) are charged into a 300 mL five-neck separable flask fitted with a thermometer, a stirrer and a nitrogen inlet, and stirred to produce a clear solution. To the clear solution is added 23.5 g (0.0800 mol) of 3,3',4,4'-biphenyltetracarboxylic dianhydride (BPDA) in the form of powder, and the reaction vessel is placed in an 120° C. oil bath for 5 minutes. Salt is precipitated from the solution after the addition of BPDA, but is immediately re-dissolved in the solution to give a clear homogenous solution while involving viscosity increase. The resultant polyamic acid has an intrinsic logarithmic viscosity of 0.81 dL/g (35° C., 0.5 g/dL).

Synthesis Example 4-2

A polyamic acid is obtained in the same manner as in Synthesis Example 4-1 except that 5.71 g (0.0500 mol) of 1,4-diaminocyclohexane (CHDA) and 4.63 g (0.0300 mol) of norbornene diamine (NBDA) are added. The resultant polyamic acid has an intrinsic logarithmic viscosity of 0.79 dL/g (35° C., 0.5 g/dL).

Synthesis Example 4-3

A polyamic acid is obtained in the same manner as in Synthesis Example 4-1 except that 6.09 g (0.0534 mol) of 1,4-diaminocyclohexane (CHDA) and 4.11 g (0.0266 mol) of norbornene diamine (NBDA) are added. The resultant polyamic acid has an intrinsic logarithmic viscosity of 1.02 dL/g (35° C., 0.5 g/dL).

Synthesis Example 4-4

A polyamic acid is obtained in the same manner as in Synthesis Example 4-1 except that 6.52 g (0.0571 mol) of 1,4-diaminocyclohexane (CHDA) and 3.53 g (0.0229 mol) of norbornene diamine (NBDA) are added. The resultant polyamic acid has an intrinsic logarithmic viscosity of 1.14 dL/g (35° C., 0.5 g/dL).

TABLE 4

| Synthesis Example | Intrinsic Viscosity [dL/g] | Diamine (Mole ratio with respect to acid anhydride) | Acid anhydride |
|---|---|---|---|
| 4-1 | 0.81 | CHDA (0.5) NBDA (0.5) | BPDA |
| 4-2 | 0.79 | CHDA (0.63) NBDA (0.37) | BPDA |

TABLE 4-continued

| Synthesis Example | Intrinsic Viscosity [dL/g] | Diamine (Mole ratio with respect to acid anhydride) | Acid anhydride |
|---|---|---|---|
| 4-3 | 1.02 | CHDA (0.67) NBDA (0.33) | BPDA |
| 4-4 | 1.14 | CHDA (0.71) NBDA (0.29) | BPDA |

Example 1

16.0 g of the polyamic acid varnish prepared in Synthesis Example 1-2 and 30.7 g of the polyimide varnish prepared in Synthesis Example 2-4 are mixed together and stirred with an impeller-less mixing/defoaming mixer (or mixing/defoaming device) (UM-118, Japan Unix) for 10 minutes to produce a block polyamic acid/imide varnish. The resultant block polyamic acid/imide varnish has an intrinsic logarithmic viscosity of 0.79 dL/g (35° C., 0.5 g/dL). In the block polyamic acid/imide, polyamic acid oligomers and polyimide oligomers are polymerized without being randomized; the ratio of the number of polyamic acid oligomers to the number of imide blocks is approximately 1. The block polyamic acid/imide varnish is spread over a glass substrate using a doctor blade. The glass substrate is placed in an oven. In a nitrogen gas stream, the glass substrate is heated from 50° C. to 250° C. over 2 hours, and heated at 250° C. for a further 2 hours to produce a polyimide film. The resultant polyimide film is measured for coefficient of thermal expansion (CTE), glass transition temperature, tensile strength, tensile modulus of elasticity, extension, and total light transmittance.

Example 2

25.0 g of the polyamic acid varnish prepared in Synthesis Example 1-3 and 22.0 g of the polyimide varnish prepared in Synthesis Example 2-4 are mixed together and stirred in the same manner as in Example 1 to produce a block polyamic acid/imide. The resultant block polyamic acid/imide varnish has an intrinsic logarithmic viscosity of 0.90 dL/g (35° C., 0.5 g/dL). A polyimide film is obtained in the same manner as in Example 1 and measurements are made.

Example 3

25.0 g of the polyamic acid varnish prepared in Synthesis Example 1-2 and 24.0 g of the polyimide varnish prepared in Synthesis Example 2-3 are mixed together and stirred in the same manner as in Example 1 to produce a block polyamic acid/imide. The resultant block polyamic acid/imide varnish has an intrinsic logarithmic viscosity of 0.75 dL/g (35° C., 0.5 g/dL). A polyimide film is obtained in the same manner as in Example 1 and measurements are made.

Example 4

35.0 g of the polyamic acid varnish prepared in Synthesis Example 1-1 and 17.5 g of the polyimide varnish prepared in Synthesis Example 2-1 are mixed together and stirred in the same manner as in Example 1 to produce a block polyamic acid/imide. The resultant block polyamic acid/imide varnish has an intrinsic logarithmic viscosity of 0.49 dL/g (35° C., 0.5 g/dL). A polyimide film is obtained in the same manner as in Example 1 and measurements are made.

Example 5

30.0 g of the polyamic acid varnish prepared in Synthesis Example 1-2 and 14.4 g of the polyimide varnish prepared in Synthesis Example 2-4 are mixed together and stirred in the same manner as in Example 1 to produce a block polyamic acid/imide. The resultant block polyamic acid/imide varnish has an intrinsic logarithmic viscosity of 0.89 dL/g (35° C., 0.5 g/dL). A polyimide film is obtained in the same manner as in Example 1 and measurements are made.

Example 6

35.0 g of the polyamic acid varnish prepared in Synthesis Example 1-2 and 16.8 g of the polyimide varnish prepared in Synthesis Example 2-2 are mixed together and stirred in the same manner as in Example 1 to produce a block polyamic acid/imide. The resultant block polyamic acid/imide varnish has an intrinsic logarithmic viscosity of 0.74 dL/g (35° C., 0.5 g/dL). A polyimide film is obtained in the same manner as in Example 1 and measurements are made.

Example 7

25.0 g of the polyamic acid varnish prepared in Synthesis Example 1-2 and 24.0 g of the polyimide varnish prepared in Synthesis Example 3-1 are mixed together and stirred in the same manner as in Example 1 to produce a block polyamic acid/imide. The resultant block polyamic acid/imide varnish has an intrinsic logarithmic viscosity of 0.53 dL/g (35° C., 0.5 g/dL). A polyimide film is obtained in the same manner as in Example 1 and measurements are made.

Example 8

35.0 g of the polyamic acid varnish prepared in Synthesis Example 1-3 and 15.4 g of the polyimide varnish prepared in Synthesis Example 3-1 are mixed together and stirred in the same manner as in Example 1 to produce a block polyamic acid/imide. The resultant block polyamic acid/imide varnish has an intrinsic logarithmic viscosity of 0.64 dL/g (35° C., 0.5 g/dL). A polyimide film is obtained in the same manner as in Example 1 and measurements are made.

Example 9

Synthesis of Block Copolymer by One-Pot Method 3.09 g (0.0200 mol) of norbornene diamine (NBDA) and 31.3 g of N-methylpyrrolidone (NMP) are charged into a 300 mL five-neck separable flask fitted with a thermometer, a stirrer, a Dean-Stark condensor and a nitrogen inlet, and stirred. To the clear solution produced is added 7.36 g (0.0250 mol) of 3,3',4,4'-biphenyltetracarboxylic dianhydride (BPDA) in the form of powder, and the reaction vessel is placed in an 120° C. oil bath for 5 minutes. Salt is precipitated from the solution after the addition of BPDA, but is immediately re-dissolved in the solution to give a clear homogenous solution while involving viscosity increase.

To the homogeneous reaction solution is added 50.0 g of xylene, and then a dehydration thermal imidization reaction is effected at 180° C. for 4 hours under stirring. After distillation of xylene, 85.2 g of N-methylpyrrolidone (NMP) and 13.2 g (0.0450 mol) of powdery 3,3',4,4'-biphenyltetracarboxylic dianhydride (BPDA) are added and stirred for a while. Thereafter, 5.71 g (0.0500 mol) of 1,4-diaminocyclohexane (CHDA) is added, and the reaction vessel is placed in a 120°

C. oil bath for 5 minutes. After removing the oil bath, stirring is continued for 4 hours at room temperature. Due to viscosity increase, 36.8 g of additional N-methylpyrrolidone (NMP) is further added, and then the solution is stirred for a further 14 hours at room temperature to produce a block polyamic acid/imide. The resultant block polyamic acid/imide has an intrinsic logarithmic viscosity of 1.20 dL/g (35° C., 0.5 g/dL). A polyimide film is obtained in the same manner as in Example 1 and measurements are made.

Comparative Example 1

A polyimide film is obtained in the same manner as in Example 1 from the polyamic acid prepared in Synthesis Example 1-4, and measurements are made.

Comparative Example 2

A polyimide film is obtained in the same manner as in Example from the polyimide prepared in Synthesis Example 2-5, and measurements are made.

Comparative Example 3

A polyimide film is obtained in the same manner as in Example 1 from the random polyimide prepared in Synthesis Example 4-1, and measurements are made.

Comparative Example 4

22.0 g of the polyamic acid varnish prepared in Synthesis Example 1-4 and 7.92 g of the polyamic acid varnish prepared in Synthesis Example 2-5 are mixed together in the same manner as in Example 1. The resultant mixture has an intrinsic logarithmic viscosity of 0.79 dL/g (35° C., 0.5 g/dL). A polyimide film is obtained in the same manner as in Example 1, and measurements are made.

Comparative Example 5

A polyimide film is obtained in the same manner as in Example 1 from the random polyimide prepared in Synthesis Example 4-3, and measurements are made.

Comparative Example 6

A polyimide film is obtained in the same manner as in Example 1 from the random polyimide prepared in Synthesis Example 4-4, and measurements are made.

Comparative Example 7

25.0 g of the polyamic acid varnish prepared in Synthesis Example 1-4 and 15.0 g of the polyamic acid varnish prepared in Synthesis Example 3-2 are mixed together in the same manner as in Example 1. The resultant mixture has an intrinsic logarithmic viscosity of 0.80 dL/g (35° C., 0.5 g/dL). A polyimide film is obtained in the same manner as in Example 1, and measurements are made.

With reference to Examples and Comparative Examples, it can be seen that films containing the block polyimides of the present invention have a low coefficient of thermal expansion, high heat resistance, and high transparency. Such films can be suitably used for resin-metal laminates for circuit boards, as well as for optical films for display devices.

TABLE 5

| Ex. | Varnish (Synthesis Example) | Intrinsic Viscosity [dL/g] | Diamine composition (weight ratio) | Acid anhydride composition (weight ratio) | m/n | CTE [ppm/K] | Tg [° C.] | Tensile strength [MPa] | Tensile modulus of elasticity [GPa] | Extension [%] | Total light transmittance [%] | MIT folding endurance |
|---|---|---|---|---|---|---|---|---|---|---|---|---|
| 1 | (1-2) + (2-4) | 0.79 | CHDA (0.39) NBDA (1) | BPDA | 3.45/6.55 | 28 | 280 | 170 | 3.9 | 28 | 88 | A |
| 2 | (1-3) + (2-4) | 0.90 | CHDA (0.78) NBDA (1) | BPDA | 5.13/4.83 | 24 | — | 190 | 4.5 | 15 | 84 | A |
| 3 | (1-2) + (2-3) | 0.75 | CHDA (0.82) NBDA (1) | BPDA | 5.26/4.74 | 21 | 286 | 194 | 4.2 | 20 | 87 | A |
| 4 | (1-1) + (2-1) | 0.49 | CHDA (1.65) NBDA (1) | BPDA | 6.90/3.10 | 19 | — | 203 | 3.8 | 16 | 86 | A |
| 5 | (1-2) + (2-4) | 0.89 | CHDA (1.65) NBDA (1) | BPDA | 6.90/3.10 | 15 | 286 | 206 | 5.1 | 11 | 86 | A |
| 6 | (1-2) + (2-2) | 0.74 | CHDA (1.85) NBDA (1) | BPDA | 7.14/2.86 | 17 | — | 199 | 4.8 | 13 | 87 | A |
| 7 | (1-2) + (3-1) | 0.53 | CHDA (0.82) NBDA (1) | BPDA (0.86) BPDA-H (1) | 5.26/4.74 | 41 | 269 | 126 | 3.2 | 22 | 88 | B |
| 8 | (1-3) + (3-1) | 0.64 | CHDA (1.65) NBDA (1) | BPDA (1.83) BPDA-H (1) | 6.90/3.10 | 29 | 290 | 160 | 4.0 | 18 | 89 | B |
| 9 | | 1.20 | CHDA (1.85) NBDA (1) | BPDA | 7.14/2.86 | 14 | 286 | 228 | 5.1 | 15 | 87 | A | m: average number of repeating units containing cyclohexanediamine n: average number of repeating units containing diamine other than cyclohexanediamine m/n: ratio between m and n

TABLE 6

| Comp. Ex | Varnish (Synthesis Example) | Intrinsic Viscosity [dL/g] | Diamine composition (weight ratio) | Acid anhydride composition (weight ratio) | m/n | CTE [ppm/K] | Tg [° C.] | Tensile strength [MPa] | Tensile modulus of elasticity [GPa] | Extension [%] | Total light transmittance [%] | MIT folding endurance |
|---|---|---|---|---|---|---|---|---|---|---|---|---|
| 1 | 1-4 | 1.32 | CHDA | BPDA | 10.00/0 | 9 | 295 | 206 | 4.3 | 8 | 88 | A |
| 2 | 2-5 | 0.44 | NBDA | BPDA | 0/10.00 | 46 | 249 | 114 | 2.8 | 6 | 89 | D |
| 3 | 4-1 | 0.81 | CHDA (0.74) NBDA (1) | BPDA | 5.00/5.00 | 34 | 277 | 146 | 3.9 | 31 | 87 | A |
| 4 | (1-4) + (2-5) | 0.79 | CHDA (1.23) NBDA (1) | BPDA | 6.24/3.76 | 29 | 284 | 144 | 3.8 | 18 | 87 | A |
| 5 | 4-3 | 1.02 | CHDA (1.48) NBDA (1) | BPDA | 6.67/3.33 | 27 | 289 | 159 | 4.1 | 21 | 87 | A |
| 6 | 4-4 | 1.14 | CHDA (1.85) NBDA (1) | BPDA | 7.14/2.86 | 24 | 283 | 173 | 4.2 | 20 | 88 | A |
| 7 | (1-4) + (3-2) | 0.80 | CHDA (0.74) NBDA (1) | BPDA (0.96) BPDA-H (1) | 5.00/5.00 | 47 | 259 | 105 | 2.6 | 14 | 88 | C | m: average number of repeating units containing cyclohexanediamine
n: average number of repeating units containing diamine other than cyclohexanediamine
m/n: ratio between m and n

Example 10

A solution containing CHDA-derived amine-terminated polyamic acid oligomer (polyimide precursor polymer varnish) is obtained in the same manner as in Synthesis Example 1-1 except that 14.8 g (0.130 mol) of CHDA (Tokyo Chemical Industry, Co. Ltd.; cis/trans ratio approximately 1), 181 g of NMP, and 36.3 g (0.124 mol) of BPDA are added. The resultant polyamic acid oligomer has an intrinsic logarithmic viscosity of 0.54 dL/g (35° C., 0.5 g/dL).

25.0 g of the polyamic acid varnish thus prepared and 22.0 g of the polyimide varnish prepared in Synthesis Example 2-4 are mixed together in the same manner as in Example 1 to produce a block polyamic acid/imide varnish. The resultant block polyamic acid/imide varnish has an intrinsic logarithmic viscosity of 0.48 dL/g (35° C., 0.5 g/dL). Manufacture of a polyimide film is conducted in the same manner as in Example 1, but the resultant polyimide film is not self-supportive.

Comparative Example 8

7.71 g (0.0500 mol) of norbornene diamine (NBDA) and 62.7 g of N-methylpyrrolidone (NMP) are charged into a 200 mL five-neck separable flask fitted with a thermometer, a stirrer, a Dean-Stark condensor and a nitrogen inlet, and stirred. To the clear solution produced is added 13.2 g (0.0450 mol) of 3,3',4,4'-biphenyltetracarboxylic dianhydride (BPDA) in the form of powder, and the reaction vessel is placed in an 120° C. oil bath for 5 minutes to produce a homogenous reaction solution. 50.0 g of xylene is added to the reaction solution. A dehydration thermal imidization reaction is effected at 180° C. under stirring. Gelation occurs 30 minutes after the start of the reaction. For this reason, subsequent evaluations cannot be made.

Comparative Example 9

1.71 g (0.0150 mol) of 1,4-diaminocyclohexane (CHDA) and 39.8 g of N-methylpyrrolidone (NMP) are charged into a 300 mL five-neck separable flask fitted with a thermometer, a stirrer, a Dean-Stark condensor and a nitrogen inlet, and stirred. To the clear solution produced is added 5.88 g (0.0200 mol) of 3,3',4,4'-biphenyltetracarboxylic dianhydride (BPDA) in the form of powder, and the reaction vessel is placed in an 120° C. oil bath for 5 minutes to produce a homogenous reaction solution. 30.0 g of xylene is added to the reaction solution. A dehydration thermal imidization reaction is effected at 180° C. under stirring. Gelation occurs 5 minutes after the start of the reaction. For this reason, subsequent evaluations cannot be made.

Examples 1 to 6 and Comparative Examples 3 to 6 provide polyimide resins in which the diamine composition is made up of a combination of cyclohexanediamine and norbornene diamine. Examples 1 to 6 provide block polyimides, Comparative Examples 3, 5 and 6 provide random polyimides, and Comparative Example 4 provides a blend of polyimides. It can be seen that Examples 1 to 6 show lower coefficients of thermal expansion (CTE) than Comparative Examples 3 to 6.

Examples 7 and 8 and Comparative Example 7 provide polyimide resins in which the diamine composition is made up of a combination of cyclohexanediamine and norbornene diamine and in which the acid dianhydride is a combination of 3,3',4,4'-biphenyltetracarboxylic dianhydride and 3,3',4,4'-dicyclohexyltetracarboxylic dianhydride. While Examples 7 and 8 provide blocks of cyclohexanediamine-containing repeating units, Comparative Example 7 provides a blend of polyimides. It can be seen that Examples 7 and 8 show lower coefficients of thermal expansion (CTE) than Comparative Example 7.

From the result of Example 10, it can be seen that a high cis isomer content in cyclohexanediamine results in a block polyimide film having poor moldability.

From the result of Comparative Example 8, it can be seen that an amine-terminated polyimide oligomer undergoes gelation. Thus, it can be seen that it is preferable to employ an acid anhydride-terminated polyimide oligomer. From the result of Comparative Example 9, it can be seen that a polyimide oligomer containing cyclohexanediamine undergoes gelation. Thus, it can be seen that it is preferable to employ a polyamic acid containing cyclohexanediamine.

Example 11

Acicular titanium oxide (FTL-300, Ishihara Sangyo Kaisha Ltd.; fiber length=5.15 μm, fiber diameter=0.27 μm) is added in the block polyamic acid/imide of Example 1 in NMP in an amount of 55 parts by weight per 100 parts by weight of the block polyamic acide/imide. The block polyamic acid/imide solution is applied over a glass substrate with a bar coater with a 0.6 mm gap, heated from room temperature to 250° C. over 2 hours in a nitrogen gas stream, and heated at 250° C. for a further 2 hours to complete imidization of the applied film. In this way a white polyimide film is obtained.

Example 12

A white polyimide film is obtained as in Example 11 except that acicular titanium oxide (FTL-300, Ishihara Sangyo Kaisha Ltd.) is added in an amount of 20 parts by weight per 100 parts of the block polyamic acid/imide.

Example 13

A white polyimide film is obtained as in Example 11 except that the bar coater gap is set to 0.25 mm.

Example 14

A white polyimide film is obtained as in Example 11 except that acicular titanium oxide (FTL-300, Ishihara Sangyo Kaisha Ltd.) is added in an amount of 400 parts by weight per 100 parts of the block polyamic acid/imide and that the bar coater gap is set to 0.3 mm.

Example 15

A white polyimide film is obtained as in Example 11 except that acicular titanium oxide (FTL-200, Ishihara Sangyo Kaisha Ltd.; fiber length=2.86 µm, fiber diameter=0.21 µm) is used instead of acicular titanium oxide (FTL-300, Ishihara Sangyo Kaisha Ltd.).

Examples 16 and 17

White polyimide films are produced as in Example 15 except that the added amount of acicular titanium oxide (FTL-200, Ishihara Sangyo Kaisha Ltd.) or the bar coater gap is changed in accordance with Table 7.

Example 18

A white polyimide film is obtained as in Example 11 except that acicular titanium oxide (FTL-110, Ishihara Sangyo Kaisha Ltd.; fiber length=1.68 µm, fiber diameter=0.13 µm) is used instead of acicular titanium oxide (FTL-300, Ishihara Sangyo Kaisha Ltd.).

Examples 19 and 20

White polyimide films are produced as in Example 18 except that the added amount of acicular titanium oxide (FTL-110, Ishihara Sangyo Kaisha Ltd.) or the bar coater gap is changed in accordance with Table 7.

Example 21

A white polyimide film is obtained as in Example 11 except that acicular titanium oxide (FTL-100, Ishihara Sangyo Kaisha Ltd.; fiber length=1.68 µm, fiber diameter=0.13 µm) is used instead of acicular titanium oxide (FTL-300, Ishihara Sangyo Kaisha Ltd.).

Examples 22 and 23

White polyimide films are produced as in Example 21 except that the added amount of acicular titanium oxide (FTL-100, Ishihara Sangyo Kaisha Ltd.) or the bar coater gap is changed in accordance with Table 7.

Example 24

A white polyimide film is obtained as in Example 11 except that spherical titanium oxide (R-980, Ishihara Sangyo Kaisha Ltd.; average particle size=0.24 µm) is used instead of acicular titanium oxide (FTL-300, Ishihara Sangyo Kaisha Ltd.).

Examples 25 and 26

White polyimide films are produced as in Example 24 except that the added amount of spherical titanium oxide (R-980, Ishihara Sangyo Kaisha Ltd.) or the bar coater gap is changed in accordance with Table 7.

Example 27

A white polyimide film is obtained as in Example 11 except that zinc oxide (average particle size=5 µm) is used instead of acicular titanium oxide (FTL-300, Ishihara Sangyo Kaisha Ltd.).

Examples 28 and 29

White polyimide films are produced as in Example 27 except that the added amount of zinc oxide or the bar coater gap is changed in accordance with Table 7.

The white polyimide films prepared in Examples 11 to 29 are measured for reflectivity for light at 550 nm wavelength in accordance with the procedure described below. These results are listed in Table 7.

Measurement of Light Reflectivity

With Hitachi U-3010 spectrophotometer (Hitachi High-Technologies Corporation), the light reflectivity of the polyimide film is measured over the range from 300 nm to 800 nm, and a value for light reflectivity measured at 550 nm is employed as light reflectivity.

TABLE 7

| | White inorganic filler | Added amount (parts by weight) | Bar coater gap (mm) | Film thickness (µm) | Light reflectivity (%) |
|---|---|---|---|---|---|
| Ex. 11 | Acicular titanium oxide: FTL-300 | 55 | 0.6 | 67 | 82 |
| Ex. 12 | Acicular titanium oxide: FTL-300 | 20 | 0.6 | 47 | 77 |
| Ex. 13 | Acicular titanium oxide: FTL-300 | 55 | 0.25 | 22 | 60 |
| Ex. 14 | Acicular titanium oxide: FTL-300 | 400 | 0.3 | 53 | 89 |
| Ex. 15 | Acicular titanium oxide: FTL-200 | 55 | 0.6 | 73 | 82 |
| Ex. 16 | Acicular titanium oxide: FTL-200 | 20 | 0.6 | 60 | 77 |
| Ex. 17 | Acicular titanium oxide: FTL-200 | 55 | 0.25 | 25 | 63 |
| Ex. 18 | Acicular titanium oxide: FTL-110 | 55 | 0.6 | 92 | 81 |
| Ex. 19 | Acicular titanium oxide: FTL-110 | 20 | 0.6 | 57 | 75 |
| Ex. 20 | Acicular titanium oxide: FTL-110 | 55 | 0.25 | 26 | 58 |
| Ex. 21 | Acicular titanium oxide: FTL-110 | 55 | 0.6 | 78 | 84 |
| Ex. 22 | Acicular titanium oxide: FTL-110 | 20 | 0.6 | 57 | 80 |
| Ex. 23 | Acicular titanium oxide: FTL-110 | 55 | 0.25 | 26 | 59 |
| Ex. 24 | Spherical titanium oxide: R-980 | 55 | 0.6 | 65 | 88 |
| Ex. 25 | Spherical titanium oxide: R-980 | 20 | 0.6 | 58 | 82 |
| Ex. 26 | Spherical titanium oxide: R-980 | 55 | 0.25 | 21 | 66 |
| Ex. 27 | Zinc oxide | 55 | 0.6 | 62 | 65 |
| Ex. 28 | Zinc oxide | 20 | 0.6 | 50 | 53 |
| Ex. 29 | Zinc oxide | 55 | 0.25 | 23 | 49 |

All of the polyimide films prepared in Examples 11 to 29 are evenly colored in white. As seen from the results of Examples 11 to 29, white polyimide films containing zinc oxide and titanium oxide exhibit a certain level of light reflectivity. In particular, it can be seen that titanium oxide provides high light reflectivity compared to zinc oxide even when they are added in equal amounts. Moreover, it can be seen that spherical titanium oxide provides high light reflectivity compared to acicular titanium oxide.

This application is entitled and claims the priority of Japanese Patent Application No. 2009-087796 filed on Mar. 31, 2009, and Japanese Patent Application No. 2009-153255 filed on Jun. 29, 2009, the disclosure of which including the specification, drawings and abstract is incorporated herein by reference in their entirety.

INDUSTRIAL APPLICABILITY

The polyimide of the present invention contains cyclohexanediamine as a diamine component and achieves low coefficient of thermal expansion, high elasticity, high transparency, and cost reduction at the same time. Thus, for example, when the polyimide of the present invention is employed to form polyimide layers of polyimide-metal laminates, possible warpage of the metal-clad laminates can be prevented.

The invention claimed is:

1. A block polyimide comprising:
blocks of repeating units represented by formula (1A); and
blocks of repeating units represented by formula (1B),

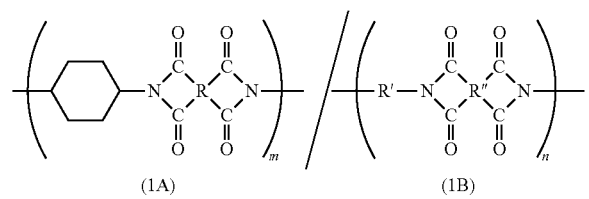

where m is the number of the repeating units represented by formula (1A),
n is the number of the repeating units represented by formula (1B),
a ratio of an average value of m to an average value of n ranges from 1:9 to 9:1,
R and R" are independently a tetravalent group having 4 to 27 carbon atoms, and independently represent an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, and
R' is a divalent group exclusive of 1,4-cyclohexylene having 4 to 51 carbon atoms, and represents, a monocyclic aliphatic group, a condensed polycyclic aliphatic group, or a non-condensed polycyclic aliphatic group in which alicyclic groups are mutually bonded to each other either directly or via a crosslinking member.

2. The block polyimide according to claim 1, wherein the ratio of the average value of m to the average value of n ranges from 2:8 to 8:2.

3. The block polyimide according to claim 1, wherein the average value of m and the average value of n are independently 2 to 1,000.

4. The block polyimide according to claim 1, wherein a cyclohexane skeleton in the repeating unit represented by formula (1A) has trans and cis isomers represented by formulas (1A-1) and (1A-2), respectively, and has a trans/cis ratio of 10:0 to 5:5.

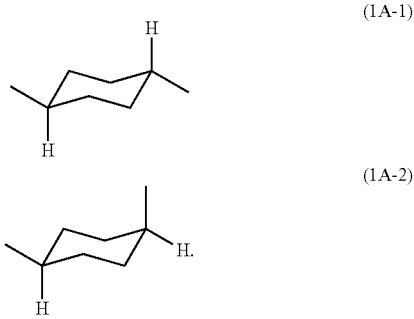

5. The block polyimide according to claim 1, wherein a logarithmic viscosity of the block polyimide in a 9:1 (weight ratio) mixture solvent of p-chlorophenol and phenol is 0.1 to 3.0 dl/g, as measured at 35° C. and at a block polyimide concentration of 0.5 g/dl.

6. A polyimide film comprising the block polyimide according to claim 1.

7. The polyimide film according to claim 6, wherein the number of double folds until failure in a folding endurance test is 10,000 or more and a coefficient of thermal expansion (CTE) is 10 to 30 ppm/K at 100° C. to 200° C.

8. A metal-clad laminate prepared by laminating the polyimide film according to claim 6 to a metal foil.

9. An optical film comprising the polyimide film according to claim 6.

10. The optical film according to claim 9, wherein the optical film is used in display device applications.

11. The optical film according to claim 9, wherein the optical film is a transparent substrate used as a panel for display devices.

12. A display device comprising the optical film according to claim 9.

13. A polyimide resin composition comprising:
the block polyimide according to claim 1; and
a coloring agent.

14. The polyimide resin composition according to claim 13, wherein the coloring agent is a whitening agent.

15. The polyimide resin composition according to claim 14, wherein the whitening agent is titanium oxide.

16. A light reflector comprising the polyimide resin composition according to claim 13 as a light reflecting material.

17. A display substrate material comprising the block polyimide according to claim 1.

18. A circuit board material comprising the block polyimide according to claim 1.

19. A coating material comprising the block polyimide according to claim 1.

20. The block polyimide according to claim 1, wherein R and R" are independently a monocyclic aromatic group, a condensed polycyclic aromatic group, or a non-condensed polycyclic aromatic group in which aromatic groups are mutually bonded to each other either directly or via a crosslinking member.

21. A block polyamic acid/imide comprising:
blocks of repeating units represented by formula (2A); and
blocks of repeating units represented by formula (2B),

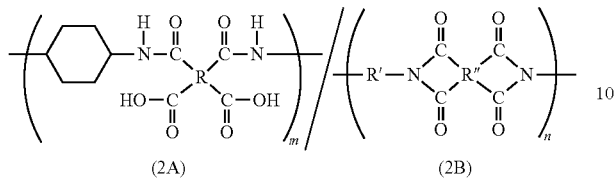

where m is the number of the repeating units represented by formula (2A),
n is the number of the repeating units represented by formula (2B),
a ratio of an average value of m to an average value of n ranges from 1:9 to 9:1,
R and R″ are independently a tetravalent group having 4 to 27 carbon atoms, and independently represent an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member, and
R′ is a divalent group exclusive of 1,4-cyclohexylene having 4 to 51 carbon atoms, and represents a monocyclic aliphatic group, a condensed polycyclic aliphatic group, or a non-condensed polycyclic aliphatic group in which alicyclic groups are mutually bonded to each other either directly or via a crosslinking member.

22. The block polyamic acid/imide according to claim 21, wherein the ratio of the average value of m to the average value of n ranges from 2:8 to 8:2.

23. The block polyamic acid/imide according to claim 21, wherein the average value of m and the average value of n are independently 2 to 1,000.

24. The block polyamic acid/imide according to claim 21, wherein a polyimide composed of the repeating units represented by formula (2B) is dissolvable in aprotic polar solvents.

25. The block polyamic acid/imide according to claim 21, wherein a logarithmic viscosity of the block polyamic acid/imide in N-methyl-2-pyrrolidone is 0.1 to 3.0 g/dl, as measured at 35° C. and at a block polyamic acid/imide concentration of 0.5 g/dl.

26. A process of producing the block polyamic acid/imide according to claim 21, comprising:
reacting a polyamic acid composed of repeating units represented by formula (2A) with a polyimide composed of repeating units represented by formula (2B), the polyimide dissolvable in aprotic polar solvents, in an aprotic polar solvent;
wherein a cyclohexane skeleton in the repeating unit represented by formula (2A) has trans and cis isomers represented by formulas (2A-1) and (2A-2), respectively, and has a trans/cis ratio of 10:0 to 5:5.

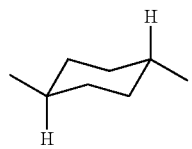

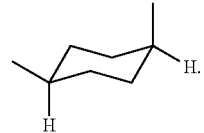

27. A block polyamic acid/imide prepared by the process according to claim 26.

28. A process of producing the block polyamic acid/imide according to claim 21, comprising:
reacting an amine-terminated polyamic acid represented by formula (2A') with an acid anhydride-terminated polyimide represented by formula (2B') in an aprotic polar solvent;
wherein the amine-terminated polyamic acid represented by formula (2A') is prepared from 1,4-cyclohexanediamine represented by formula (3) and from a tetracarboxylic dianhydride represented by formula (4), a ratio of 1,4-cyclohexanediamine represented by formula (3) to the tetracarboxylic dianhydride represented by formula (4) being in the range of greater than 1 to 2 or less, and
the acid anhydride-terminated polyimide represented by formula (2B') is prepared from a diamine represented by formula (5) and from a tetracarboxylic dianhydride represented by formula (6), a ratio of the diamine represented by formula (5) to the tetracarboxylic dianhydride represented by formula (6) being in the range of 0.5 to less than 1,

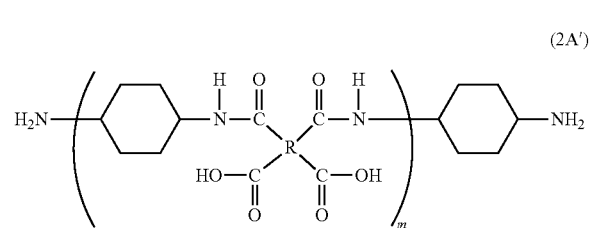

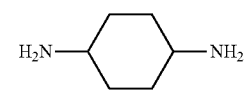

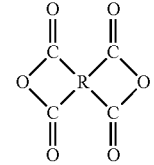

where R is a tetravalent group having 4 to 27 carbon atoms, and represents an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member;

or a non-condensed polycyclic aromatic group in which aromatic groups are mutually bonded to each other either directly or via a crosslinking member, 1,4-cyclohexanediamine has trans and cis isomers represented by formulas (3-1) and (3-2), respectively, and has a trans/cis ratio of 10:0 to 5:5,

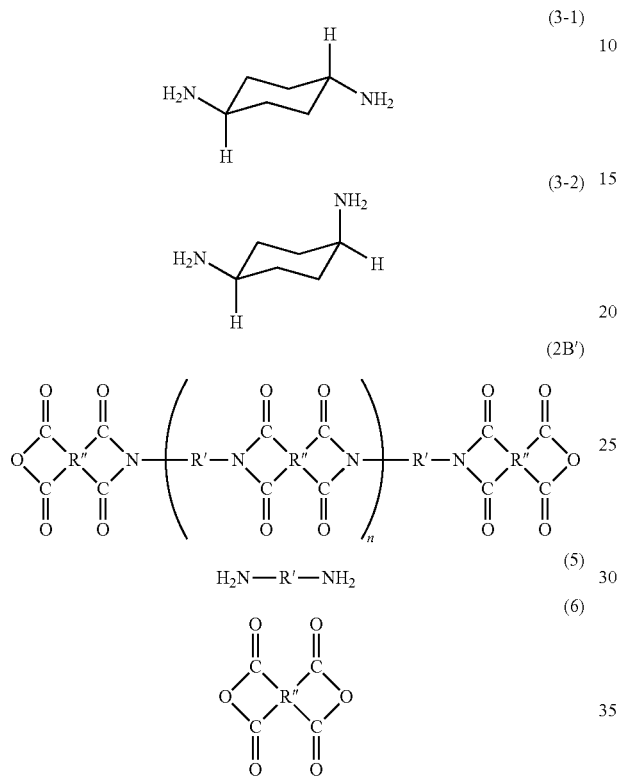

where R' is a divalent group exclusive of 1,4-cyclohexylene having 4 to 51 carbon atoms, and represents a monocyclic aliphatic group, a condensed polycyclic aliphatic group, or a non-condensed polycyclic aliphatic group in which alicyclic groups are mutually bonded to each other either directly or via a crosslinking member, and R" is a tetravalent group having 4 to 27 carbon atoms, and represents an aliphatic group, a monocyclic aliphatic group, a condensed polycyclic aliphatic group, a monocyclic aromatic group or a condensed polycyclic aromatic group; a non-condensed polycyclic aliphatic group in which alicyclic groups are mutually bonded to each other either directly or via a crosslinking member; or a non-condensed polycyclic aromatic group in which aromatic groups are mutually bonded to each other either directly or via a crosslinking member.

29. A polyamic acid/imide varnish comprising the block polyamic acid/imide according to claim 21.

30. A metal-clad laminate prepared by applying the polyamic acid/imide varnish according to claim 29 over a metal foil, and subjecting the varnish to drying and imidization.

31. A block polyamic acid/imide composition comprising:
the block polyamic acid/imide according to claim 21; and
a coloring agent.

32. The block polyamic acid/imide composition according to claim 31, wherein the coloring agent is a whitening agent.

33. The block polyamic acid/imide composition according to claim 32, wherein the whitening agent is titanium oxide.

34. The block polyamic acid/imide according to claim 21, wherein R and R" are independently a monocyclic aromatic group, a condensed polycyclic aromatic group, or a non-condensed polycyclic aromatic group in which aromatic groups are mutually bonded to each other either directly or via a crosslinking member.

* * * * *